(12) United States Patent
Pandev et al.

(10) Patent No.: US 10,580,673 B2
(45) Date of Patent: Mar. 3, 2020

(54) SEMICONDUCTOR METROLOGY AND DEFECT CLASSIFICATION USING ELECTRON MICROSCOPY

(71) Applicant: KLA-Tencor Corporation, Milpitas, CA (US)

(72) Inventors: Stilian Pandev, Santa Clara, CA (US); Alexander Kuznetsov, Austin, TX (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/198,658

(22) Filed: Nov. 21, 2018

(65) Prior Publication Data

US 2019/0214285 A1 Jul. 11, 2019

Related U.S. Application Data

(60) Provisional application No. 62/613,946, filed on Jan. 5, 2018.

(51) Int. Cl.
*H01L 21/67* (2006.01)
*H01L 21/66* (2006.01)
(Continued)

(52) U.S. Cl.
CPC ........ *H01L 21/67288* (2013.01); *G06T 7/001* (2013.01); *H01L 22/20* (2013.01);
(Continued)

(58) Field of Classification Search
CPC ... H01L 21/67288; H01L 21/20; H01L 22/00; H01L 22/12; H01L 22/14; H01L 22/34
See application file for complete search history.

(56) References Cited

U.S. PATENT DOCUMENTS 5,608,526 A    3/1997   Piwonka-Corle et al.
5,859,424 A    1/1999   Norton et al.
(Continued)

FOREIGN PATENT DOCUMENTS

JP    2007218711 A    8/2007

OTHER PUBLICATIONS

PCT/US2018/068093, International Search Report, dated Apr. 25, 2019.
(Continued)

*Primary Examiner* — Cuong Q Nguyen
(74) *Attorney, Agent, or Firm* — Huse IP Law; Charles C. Huse

(57) ABSTRACT

In some embodiments, a first plurality of electron-microscope images for respective instances of a semiconductor structure is obtained from a first source. The electron-microscope images of the first plurality show different values of one or more semiconductor-fabrication parameters. A model is trained that specifies a relationship between the first plurality of electron-microscope images and the values of the one or more semiconductor-fabrication parameters. A second plurality of electron-microscope images for respective instances of the semiconductor structure on one or more semiconductor wafers is collected. The one or more semiconductor wafers are distinct from the first source. Values of the one or more semiconductor-fabrication parameters for the second plurality of electron-microscope images are predicted using the model.

22 Claims, 6 Drawing Sheets

(51) Int. Cl.
*G06T 7/00* (2017.01)
*G06K 9/62* (2006.01)

(52) U.S. Cl.
CPC .. *G06K 9/6267* (2013.01); *G06T 2207/10056* (2013.01); *G06T 2207/20081* (2013.01); *G06T 2207/30148* (2013.01); *H01L 22/12* (2013.01)

(56) References Cited

U.S. PATENT DOCUMENTS

| | | |
|---|---|---|
| 6,429,943 B1 | 8/2002 | Opsal et al. |
| 7,478,019 B2 | 1/2009 | Zangooie et al. |
| 7,732,761 B2 | 6/2010 | Tanaka et al. |
| 7,933,026 B2 | 4/2011 | Opsal et al. |
| 9,518,916 B1 | 12/2016 | Pandev et al. |
| 9,915,522 B1 | 3/2018 | Jiang et al. |
| 2012/0126117 A1 | 5/2012 | Nakahira et al. |
| 2013/0110477 A1 | 5/2013 | Pandev |
| 2014/0172394 A1 | 6/2014 | Kuznetsov et al. |
| 2014/0222380 A1 | 8/2014 | Kuznetsov et al. |
| 2014/0297211 A1 | 10/2014 | Pandev et al. |
| 2014/0316730 A1 | 10/2014 | Shchegrov et al. |
| 2015/0046118 A1 | 2/2015 | Pandev et al. |
| 2015/0204664 A1 | 7/2015 | Bringoltz et al. |
| 2016/0003609 A1 | 1/2016 | Shchegrov et al. |
| 2016/0117812 A1 | 4/2016 | Pandev et al. |
| 2016/0117847 A1 | 4/2016 | Pandev et al. |
| 2017/0193680 A1 | 7/2017 | Zhang et al. |
| 2017/0200265 A1 | 7/2017 | Bhaskar et al. |
| 2019/0196334 A1 * | 6/2019 | Tel .......................... G03F 7/705 |
| 2019/0258178 A1 * | 8/2019 | Ten Berge .......... G03F 7/70625 |
| 2019/0310554 A1 * | 10/2019 | Middlebrooks ......... G03F 7/705 |

OTHER PUBLICATIONS

PCT/US2018/068093, Written Opinion of the International Searching Authority, dated Apr. 25, 2019.

* cited by examiner

```
                                    100 ─┐

┌─────────────────────────────────────────────────────────────────────────────────────┐
│ Obtain, from a first source, a first plurality of electron-microscope images for    │
│ respective instances of a semiconductor structure. The electron-microscope images   │
│ of the first plurality show different values of one or more semiconductor-          │
│ fabrication parameters. (102)                                                       │
│  ┌─────────────────────────────────────────────────────────────────────────────┐   │
│  │ The first source includes a DOE wafer in which different fields are         │   │
│  │ fabricated to have the different values. Respective images of the first     │   │
│  │ plurality of electron-microscope images are obtained from respective        │   │
│  │ fields of the DOE wafer. (104)                                              │   │
│  └─────────────────────────────────────────────────────────────────────────────┘   │
│  ┌─────────────────────────────────────────────────────────────────────────────┐   │
│  │ The first source includes a plurality of DOE wafers in which different      │   │
│  │ wafers are fabricated to have the different values. Respective images of    │   │
│  │ the first plurality of electron-microscope images are obtained from         │   │
│  │ respective wafers of the plurality of DOE wafers. (106)                     │   │
│  └─────────────────────────────────────────────────────────────────────────────┘   │
│  ┌─────────────────────────────────────────────────────────────────────────────┐   │
│  │ The first plurality of electron-microscope images includes simulated        │   │
│  │ electron-microscope images. (108)                                           │   │
│  └─────────────────────────────────────────────────────────────────────────────┘   │
└─────────────────────────────────────────────────────────────────────────────────────┘
                                         ↓
┌─────────────────────────────────────────────────────────────────────────────────────┐
│ Determine the values of the one or more semiconductor-fabrication parameters for    │
│ the first plurality of electron-microscope images using a reference metrology tool. │
│ (110)                                                                               │
└─────────────────────────────────────────────────────────────────────────────────────┘
                                         ↓
┌─────────────────────────────────────────────────────────────────────────────────────┐
│ Train a model that specifies a relationship between the first plurality of          │
│ electron-microscope images and the values of the one or more semiconductor-         │
│ fabrication parameters. (112)                                                       │
└─────────────────────────────────────────────────────────────────────────────────────┘
                                         ↓
┌─────────────────────────────────────────────────────────────────────────────────────┐
│ Collect a second plurality of electron-microscope images for respective instances   │
│ of the semiconductor structure on one or more semiconductor wafers. The one or      │
│ more semiconductor wafers are distinct from the first source. (114)                 │
└─────────────────────────────────────────────────────────────────────────────────────┘
                                         ↓
┌─────────────────────────────────────────────────────────────────────────────────────┐
│ Predict values of the one or more semiconductor-fabrication parameters for the      │
│ second plurality of electron-microscope images, using the model. (116)              │
└─────────────────────────────────────────────────────────────────────────────────────┘
                     ↓                   ↓                    ↓
┌──────────────────────────┐  ┌──────────────────────┐  ┌──────────────────────────┐
│ Adjust a fabrication     │  │ Disposition the one  │  │ Estimate performance of  │
│ process used to          │  │ or more semiconductor│  │ semiconductor devices on │
│ fabricate the one or     │  │ wafers based at least│  │ the one or more          │
│ more semiconductor       │  │ in part on the       │  │ semiconductor wafers     │
│ wafers, based at least   │  │ predicted values.    │  │ based at least in part   │
│ in part on the predicted │  │ (120)                │  │ on the predicted values. │
│ values. (118)            │  │                      │  │ (122)                    │
└──────────────────────────┘  └──────────────────────┘  └──────────────────────────┘
```

Obtain, from a first source, a first plurality of electron-microscope images for respective instances of a semiconductor structure. The electron-microscope images of the first plurality show different values of one or more semiconductor-fabrication parameters. (102)

> The first source includes a DOE wafer in which different fields are fabricated to have the different values. Respective images of the first plurality of electron-microscope images are obtained from respective fields of the DOE wafer. (104)

> The first source includes a plurality of DOE wafers in which different wafers are fabricated to have the different values. Respective images of the first plurality of electron-microscope images are obtained from respective wafers of the plurality of DOE wafers. (106)

> The first plurality of electron-microscope images includes simulated electron-microscope images. (108)

Associate the first plurality of electron-microscope images with respective defect classes. (210)

> The respective defect classes include defect classes on the DOE wafer or the plurality of DOE wafers. (211)

Train a model that specifies a relationship between the first plurality of electron-microscope images and the defect classes. (212)

Collect a second plurality of electron-microscope images for respective instances of the semiconductor structure on one or more semiconductor wafers. The one or more semiconductor wafers are distinct from the first source. (114)

Predict one or more defect classes for defects on the one or more semiconductor wafers, using the model. (216)

Adjust a fabrication process used to fabricate the one or more semiconductor wafers, based at least in part on the predicted one or more defect classes. (218)

Disposition the one or more semiconductor wafers based at least in part on the predicted one or more defect classes. (220)

Figure 2

SEMICONDUCTOR METROLOGY AND DEFECT CLASSIFICATION USING ELECTRON MICROSCOPY

RELATED APPLICATION

This application claims priority to U.S. Provisional Patent Application No. 62/613,946, filed Jan. 5, 2018, titled "Method for Metrology and Defect Detection on Device Like Structures Using CD-SEM Images," which is hereby incorporated by reference in its entirety for all purposes.

TECHNICAL FIELD

This disclosure relates to semiconductor inspection, and more specifically to semiconductor metrology and/or defect classification using electron-microscope images.

BACKGROUND

Semiconductor metrology may be performed by explicitly measuring dimensions of semiconductor structures in electron-microscope images. For example, to measure line spacing (i.e., pitch), line edges as shown in a critical-dimension scanning-electron-microscope (CD-SEM) image are averaged and the distances between successive average values are determined. Such measurements may be noisy and inaccurate, however, and are hard to perform for arbitrary or complex structures. Non-geometric parameters (e.g., lithographic focus and dose) are difficult to determine using such measurements, as are some geometric parameters (e.g., overlay, film thickness, and sidewall angle). Such measurements also fail to exploit information in the images outside of the features being measured.

SUMMARY

Accordingly, there is a need for improved methods and systems of using electron-microscope images to determine values of semiconductor-fabrication parameters.

In some embodiments, a first method of monitoring semiconductor fabrication is performed in a computer system that includes one or more processors and memory storing instructions for execution by the one or more processors. In the first method, a first plurality of electron-microscope images for respective instances of a semiconductor structure is obtained from a first source. The electron-microscope images of the first plurality show different values of one or more semiconductor-fabrication parameters. A model is trained that specifies a relationship between the first plurality of electron-microscope images and the values of the one or more semiconductor-fabrication parameters. A second plurality of electron-microscope images for respective instances of the semiconductor structure on one or more semiconductor wafers is collected. The one or more semiconductor wafers are distinct from the first source. Values of the one or more semiconductor-fabrication parameters for the second plurality of electron-microscope images are predicted using the model.

In some embodiments, a second method of monitoring semiconductor fabrication is performed in a computer system that includes one or more processors and memory storing instructions for execution by the one or more processors. In the second method, a first plurality of electron-microscope images for respective instances of a semiconductor structure is obtained from a first source. The electron-microscope images of the first plurality show different values of one or more semiconductor-fabrication parameters. The first plurality of electron-microscope images is associated with respective defect classes. A model is trained that specifies a relationship between the first plurality of electron-microscope images and the defect classes. A second plurality of electron-microscope images for respective instances of the semiconductor structure on one or more semiconductor wafers is collected. The one or more semiconductor wafers are distinct from the first source. One or more defect classes for defects on the one or more semiconductor wafers are predicted using the model.

In some embodiments, a third method of monitoring semiconductor fabrication is performed in a computer system that includes one or more processors and memory storing instructions for execution by the one or more processors. In the third method, simulated electron-microscope images for respective modeled instances of a semiconductor structure are obtained. The electron-microscope images of the first plurality show different values of one or more semiconductor-fabrication parameters. A plurality of electron-microscope images for respective instances of the semiconductor structure on one or more semiconductor wafers is collected. Values of the one or more semiconductor-fabrication parameters for the plurality of electron-microscope images are predicted using the simulated electron-microscope images. Predicting the values includes performing a regression analysis between the plurality of electron-microscope images and the simulated electron-microscope images.

In some embodiments, a computer system includes one or more processors and memory storing one or more programs for execution by the one or more processors. The one or more programs include instructions for performing the above first method, second method, and/or third method. In some embodiments, a non-transitory computer-readable storage medium stores one or more programs configured for execution by a computer system. The one or more programs include instructions for performing the above first method, second method, and/or third method.

BRIEF DESCRIPTION OF THE DRAWINGS

For a better understanding of the various described implementations, reference should be made to the Detailed Description below, in conjunction with the following drawings.

FIGS. 1-3 show flowcharts of respective methods of monitoring semiconductor fabrication in accordance with some embodiments.

Like reference numerals refer to corresponding parts throughout the drawings and specification.

DETAILED DESCRIPTION

Figure 3:
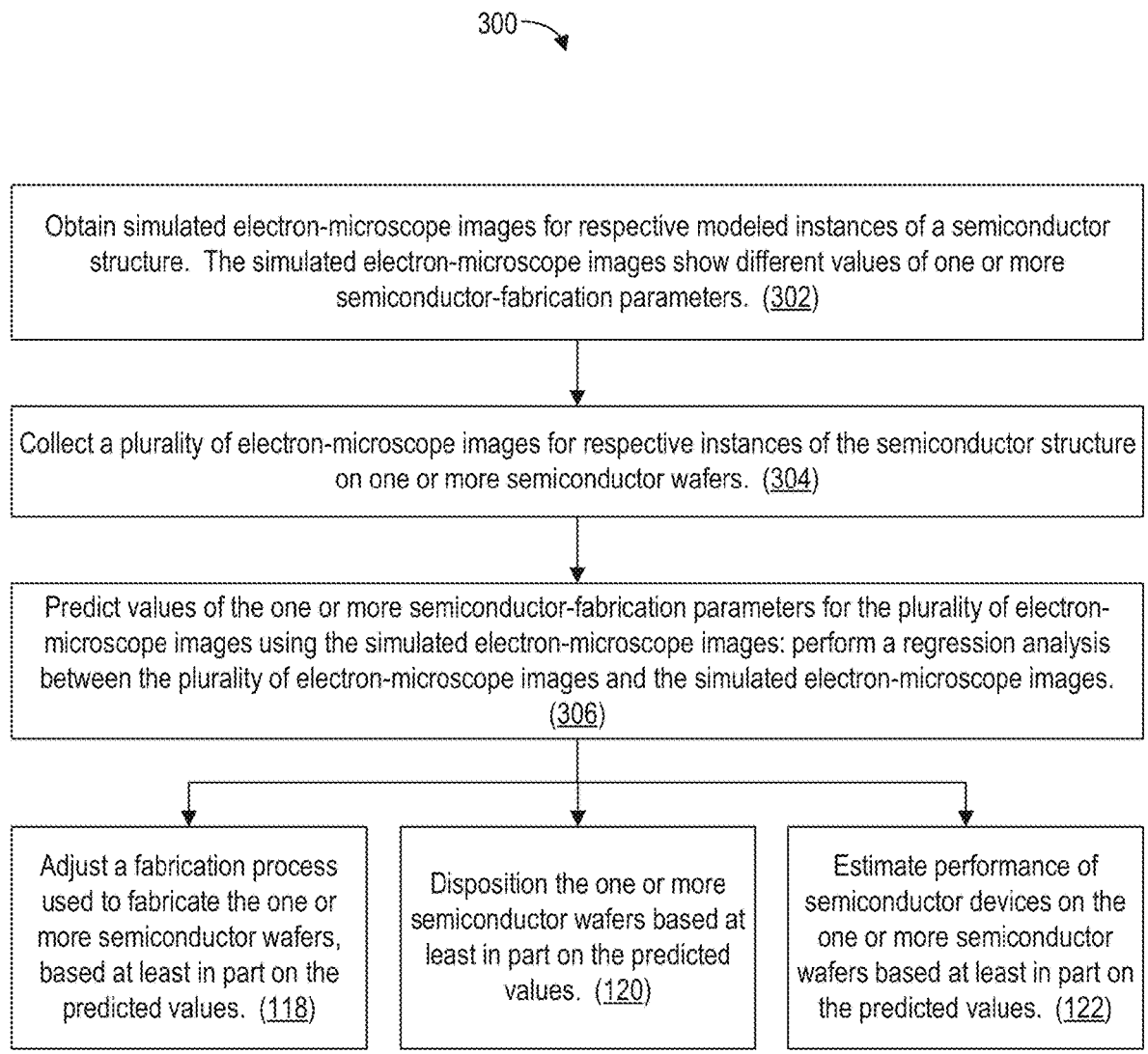

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

FIG. 1 shows a flowchart of a method 100 of monitoring semiconductor fabrication in accordance with some embodiments. The method 100 may be performed in a computer system (e.g., the computer system of the semiconductor-inspection system 700, FIG. 7). Steps in the method 100 may be combined or broken out.

In the method 100, a first plurality of electron-microscope images for respective instances of a semiconductor structure is obtained (102) from a first source. The electron-microscope images of the first plurality show different values of one or more semiconductor-fabrication parameters. For example, each electron-microscope image of the first plurality, or respective groups of electron-microscope images of the first plurality, may show a different set of values of the one or more semiconductor-fabrication parameters. The first plurality of electron-microscope images may be scanning-electron-microscope (SEM) images (e.g., CD-SEM images) or transmission-electron-microscope (TEM) images.

The one or more semiconductor-fabrication parameters may include one or more geometric parameters (e.g., critical dimension, overlay, edge-placement error, sidewall angle, etc.). Alternatively, or in addition, the one or more semiconductor-fabrication parameters may include one or more non-geometric parameters. The non-geometric parameters may include parameters relating to one or more steps in a semiconductor-fabrication process (e.g., a photolithographic step, etch step, deposition step, etc.). For example, the one or more semiconductor-fabrication parameters may include focus and/or dose for a photolithographic step. The dose parameter for a photolithographic step quantifies the amount of illumination, and thus the number of photons, provided to the semiconductor wafer (e.g., to a particular field in the semiconductor wafer, where a single field is illuminated at a time).

The semiconductor structure may be any arbitrary structure on a semiconductor wafer. For example, the semiconductor structure may be a test structure designed to characterize the performance of a semiconductor-fabrication process, or may be part of a semiconductor device (e.g., a die on a semiconductor wafer). The semiconductor structure may be formed, and the electron-microscope images obtained, after one or more steps of a semiconductor fabrication process have been performed but before the semiconductor fabrication process is complete.

Figure 6:
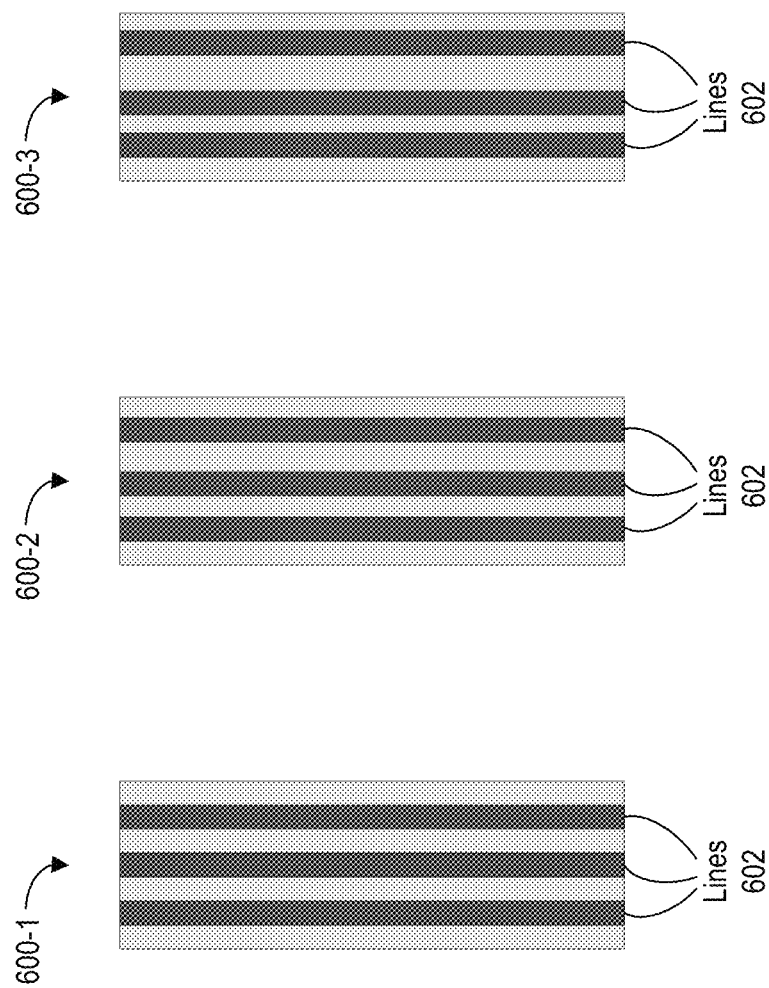
FIG. 6 shows a plurality of electron-microscope images with varying overlay values and thus varying degrees of pitch error.

FIG. 6 shows prophetic examples of images 600-1, 600-2, and 600-3 of a semiconductor structure with a plurality of lines 602 (e.g., metal lines) fabricated using double-patterning photolithography (i.e., using a first photolithography step followed by a second photolithography step), in accordance with some embodiments. The images 600-1, 600-2, and 600-3 are examples of electron-microscope images of the first plurality and may be real or simulated electron-microscope images. Overlay between the first photolithography step and the second photolithography step is varied for the images 600-1, 600-2, and 600-3, resulting in different degrees of pitch error for each image 600. Image 600-1 shows no pitch error, image 600-2 shows a first degree of pitch error (e.g., measured as a percentage), and image 600-3 shows a second degree of pitch error that is greater than the first degree.

In some embodiments, the first source includes (104) a design-of-experiments (DOE) wafer in which different fields are fabricated to have the different values. Respective images of the first plurality of electron-microscope images are obtained from respective fields of the DOE wafer. The wafer is called a DOE wafer because it is fabricated based on an experimental design (i.e., a "design of experiments" or DOE), such that it has the different values for the different fields. Each field may be fabricated to have different values for the one or more semiconductor-fabrication parameters, or respective groups of fields may be fabricated such that each group has different values for the one or more semiconductor-fabrication parameters. (Unintentional variation of parameter values between and within fields may also occur.)

In some embodiments, the first source includes (106) a plurality of DOE wafers in which different wafers are fabricated to have the different values. Respective images of the first plurality of electron-microscope images are obtained from respective wafers of the plurality of DOE wafers. The wafers are called DOE wafers because they are fabricated based on a design of experiments, such that different wafers have different values. Each wafer may be fabricated to have different values for the one or more semiconductor-fabrication parameters, or respective groups of wafers may be fabricated such that each group has different values for the one or more semiconductor-fabrication parameters. (Unintentional variation of parameter values between wafers and on a wafer may also occur.)

In some embodiments, the first plurality of electron-microscope images includes (108) simulated electron-microscope images. For example, all of the electron-microscope images of the first plurality may be simulated electron-microscope images. Simulated electron-microscope images may be obtained using the method 400 (FIG. 4) or 500 (FIG. 5), as described below.

In some embodiments, the values of the one or more semiconductor-fabrication parameters for the first plurality of electron-microscope images are determined (110) using a reference metrology tool (e.g., the electron microscope that took the first plurality of images). The reference metrology tool may be the same tool or type of tool used to collect images in step 114 (below) or may be a different (e.g., more precise but slower) tool or type of tool. If the reference metrology tool is the same tool or type of tool used in step 114, tool settings may be the same as those used in step 114 or may be different (e.g., more precise but slower).

A model is trained (112) that specifies a relationship between the first plurality of electron-microscope images and the values of the one or more semiconductor-fabrication parameters. In some embodiments, the model is a neural network. In some embodiments, the model is trained using supervised learning.

A second plurality of electron-microscope images for respective instances of the semiconductor structure on one or more semiconductor wafers is collected (114). The one or more semiconductor wafers are distinct from the first source. The second plurality of electron-microscope images may be the same type of electron-microscope images as the first plurality of electron-microscope images, and thus may be SEM images (e.g., CD-SEM images) or TEM images. While the electron-microscope images of the first plurality may be actual or simulated electron-microscope images, the electron-microscope images of the second plurality are actual images.

Values of the one or more semiconductor-fabrication parameters for the second plurality of electron-microscope images are predicted (116) using the model.

In some embodiments, a fabrication process used to fabricate the one or more semiconductor wafers is adjusted (118) based at least in part on the predicted values. For example, if the prediction indicates that the predicted values differ from respective target values by an amount that satisfies (e.g., exceeds, or equals or exceeds) a threshold, the process is adjusted so that values for future wafers will be within range of the target values (e.g., will not satisfy the threshold difference). In some embodiments, the one or more semiconductor wafers are dispositioned (120) based at least in part on the predicted values. Dispositioning a respective wafer may include selecting between continuing to process the respective wafer, reworking the respective wafer, or scrapping the respective wafer. In some embodiments, performance of semiconductor devices on the one or more semiconductor wafers is estimated (122) based at least in part on the predicted values. The method 100 may include none, one or more, or all of the steps 118, 120, and 122.

FIG. 2 shows a flowchart of another method 200 of monitoring semiconductor fabrication in accordance with some embodiments. The method 200, like the method 100, may be performed in a computer system (e.g., the computer system of the semiconductor-inspection system 700, FIG. 7). Steps in the method 200 may be combined or broken out.

In the method 200, step 102 is performed, as described above for the method 100 (FIG. 1). In some embodiments, step 102 includes step 104, 106, or 108. For step 108, the method 400 (FIG. 4) or 500 (FIG. 5) may be used, in accordance with some embodiments.

The first plurality of electron-microscope images is associated (210) with respective defect classes. In some embodiments, the respective defect classes include (211) defect classes on the DOE wafer (for embodiments that include step 104) or the plurality of DOE wafers (for embodiments that include step 106). The respective defect classes may correspond to defects that are not visible in respective images of the first plurality but are present on respective wafers, or wafer fields, on which the images were taken. For example, a first defect class corresponds to a first type of defect that is visible on a first wafer or wafer field on which a first image was taken, and so on for other defect classes, wafers or wafer fields, and images. In some embodiments, the respective defect classes correspond to defects that are not visible in respective images of the first plurality but are known to be associated with one or more respective values of semiconductor-fabrication parameters that correspond to respective images (e.g., match the values shown in respective images to within a specified degree). In some embodiments, the respective defect classes correspond to defects that are visible in respective images of the first plurality.

A model is trained (212) that specifies a relationship between the first plurality of electron-microscope images and the defect classes. In some embodiments, the model is a neural network.

In some embodiments, the types of defects for the defect classes are unspecified (e.g., unknown) when the first plurality of electron-microscope images is obtained. To train the model, unsupervised learning may be used to determine the relationship between the first plurality of electron-microscope images and the defect classes while types of defects for the defect classes are unspecified. After the relationship has been determined and the types of defects for the defect classes have been specified (e.g., are known), the defect classes are labelled with labels that specify the types of defects for the defect classes. Alternatively, the types of defects for the defect classes are specified (e.g., known) before step 212 (e.g., when the first plurality of electron-microscope images is obtained), and the model is trained using supervised learning.

A second plurality of electron-microscope images for respective instances of the semiconductor structure on one or more semiconductor wafers is collected (114), as described above for the method 100 (FIG. 1).

One or more defect classes for defects on the one or more semiconductor wafers are predicted (216) using the model. Defects on the one or more semiconductor wafers are thus classified using the model.

In some embodiments, a fabrication process used to fabricate the one or more semiconductor wafers is adjusted (218) based at least in part on the predicted one or more defect classes. In some embodiments, the one or more semiconductor wafers are dispositioned (220) based at least in part on the predicted one or more defect classes. Dispositioning a respective wafer may include selecting between continuing to process the respective wafer, reworking the respective wafer, or scrapping the respective wafer. The method 200 may include none, one, or both of the steps 218 and 220.

FIG. 3 shows a flowchart of yet another method 300 of monitoring semiconductor fabrication in accordance with some embodiments. The method 300, like the methods 100 and/or 200, may be performed in a computer system (e.g., the computer system of the semiconductor-inspection system 700, FIG. 7). Steps in the method 300 may be combined or broken out.

In the method 300, simulated electron-microscope images for respective modeled instances of a semiconductor structure are obtained (302). The simulated electron-microscope images show different values of one or more semiconductor-fabrication parameters. For example, each simulated electron-microscope image, or respective group of simulated electron-microscope images, may show a different set of values of the one or more semiconductor-fabrication parameters. The simulated electron-microscope images may be simulated SEM images (e.g., simulated CD-SEM images) or simulated TEM images. In some embodiments, the simulated electron-microscope images may be obtained using the method 400 (FIG. 4) or 500 (FIG. 5).

As for step 102 in the methods 100 and 200 (FIGS. 1-2), the semiconductor structure may be any arbitrary structure (e.g., a test structure or part of a semiconductor device) (e.g., the plurality of lines 602, FIG. 6). The semiconductor structure may be a structure that, if actually fabricated, would be formed after one or more steps of a semiconductor fabrication process have been performed but before the entire semiconductor fabrication process is complete.

A plurality of electron-microscope images for respective instances of the semiconductor structure on one or more semiconductor wafers is collected (304). The plurality of electron-microscope images thus includes actual, as opposed to simulated, electron-microscope images.

Values of the one or more semiconductor-fabrication parameters are predicted (306) for the plurality of electron-microscope images using the simulated electron-microscope images. Making this prediction includes performing a regression analysis between the plurality of electron-microscope images and the simulated electron-microscope images. The regression analysis may minimize a signal difference between the plurality of electron-microscope images collected in step 304 and the simulated electron-microscope images obtained in step 302. The method 300, unlike the method 100, thus does not involve the model of steps 112 and 116 (FIG. 1).

In some embodiments, steps 118, 120, and/or 122 are performed, as described above for the method 100 (FIG. 1).

Figure 4:
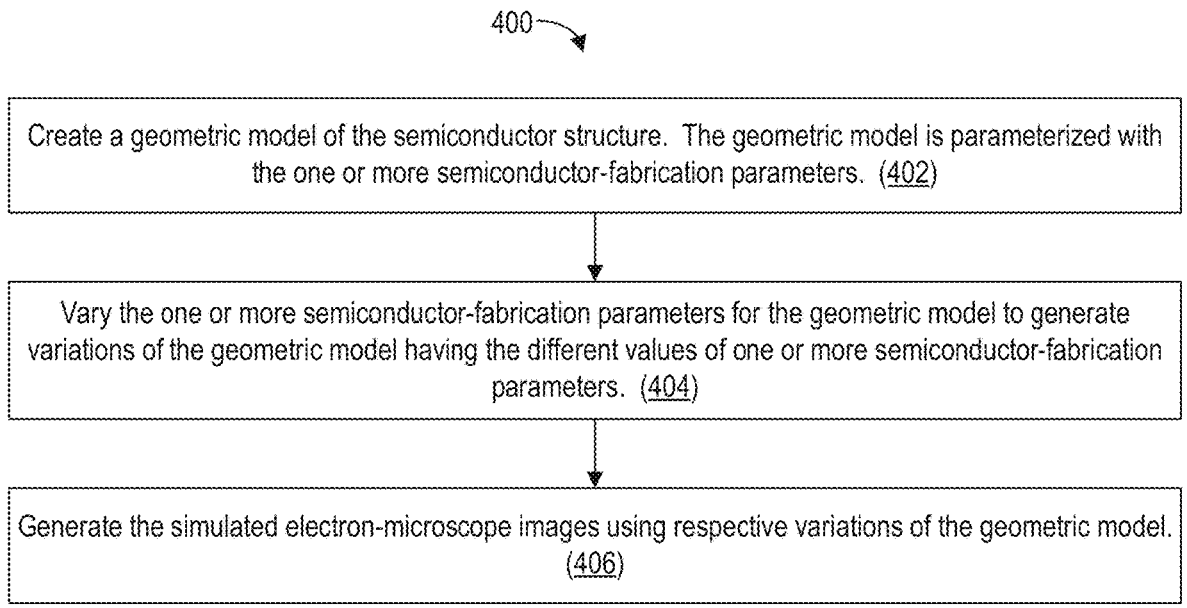
FIGS. 4 and 5 show flowcharts of respective methods of obtaining simulated electron-microscope images in accordance with some embodiments.
Figure 5:
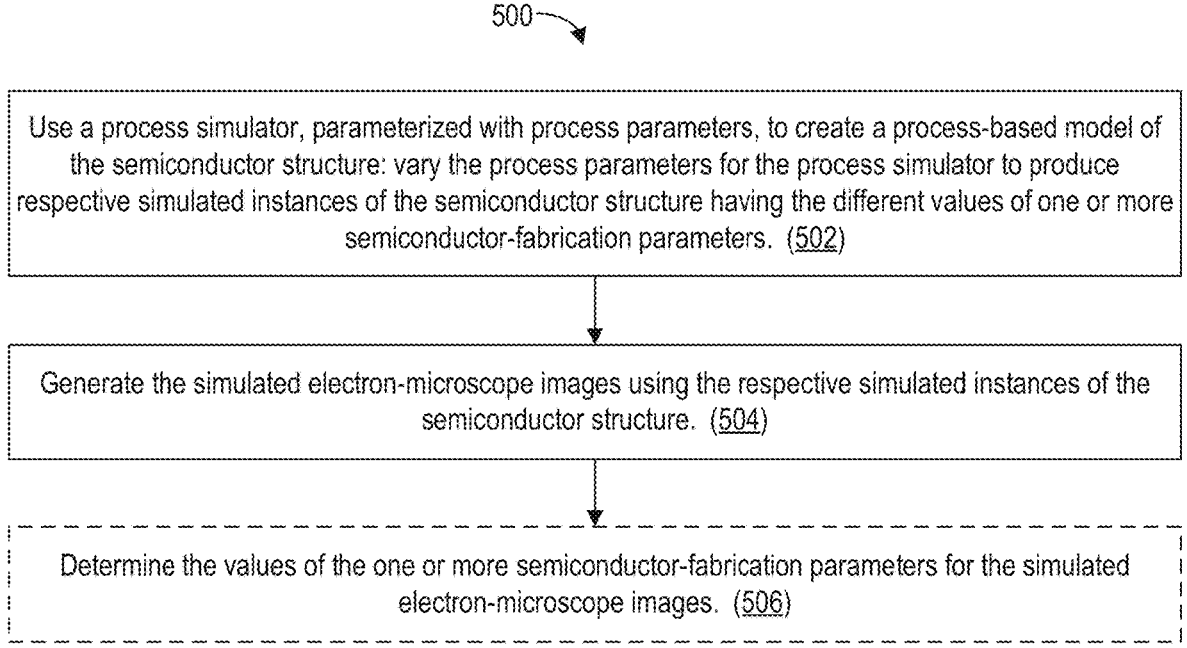

FIG. 4 shows a flowchart of a method 400 of obtaining simulated electron-microscope images in accordance with some embodiments. In the method 400, a geometric model of the semiconductor structure is created (402). The geometric model is parameterized with the one or more semiconductor-fabrication parameters, which may be geometric parameters. The one or more semiconductor-fabrication parameters for the geometric model are varied (404) to generate variations of the geometric model (i.e., to generate respective modeled instances of the semiconductor structure) having the different values of one or more semiconductor-fabrication parameters. The simulated electron-microscope images are generated (406) using respective variations of the geometric model (i.e., using respective modeled instances). For example, each simulated image is generated based on a distinct variation of the geometric model. The image simulation is performed using an image simulator (e.g., image-simulation module 718, FIG. 7) that receives the variations as input.

FIG. 5 shows a flowchart of another method 500 of obtaining simulated electron-microscope images in accordance with some embodiments. In the method 500, a process-based model of the semiconductor structure is created (502) using a process simulator that is parameterized with process parameters. The process parameters for the process simulator are varied to produce respective simulated instances of the semiconductor structure having the different values of one or more semiconductor-fabrication parameters. For example, respective iterations of process simulation are performed with different process-parameter values to produce the respective simulated instances of the semiconductor structure. The process parameters specify details about how one or more process steps (e.g., photolithography, etch, deposition, etc.) are performed and thus are not geometric parameters. For example, the process parameters may include focus and/or dose for one or more photolithography steps. Respective process parameters may be distinct from the one or more semiconductor fabrication parameters of steps 102 (FIGS. 1-2) and 302 (FIG. 3) or alternatively may be the same. The simulated electron-microscope images are generated (504) using the respective simulated instances of the semiconductor structure, which are provided as input to an image simulator (e.g., image-simulation module 718, FIG. 7). For example, each simulated image is generated based on a distinct instance of the semiconductor structure provided by the process simulator.

Figure 7:
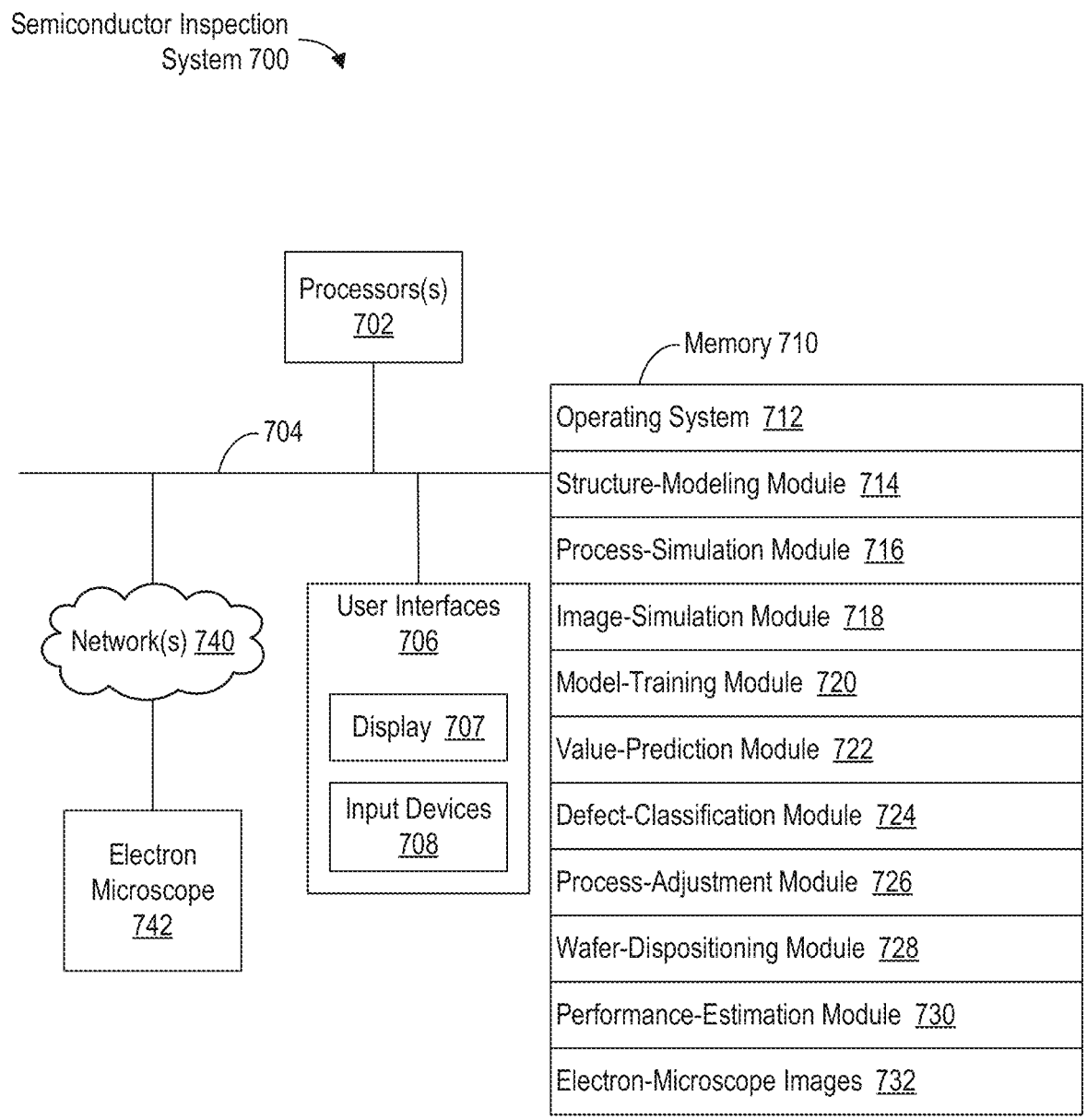
FIG. 7 is a block diagram of a semiconductor-inspection system in accordance with some embodiments.

FIG. 7 is a block diagram of a semiconductor-inspection system 700 in accordance with some embodiments. The semiconductor-inspection system 700 includes an electron microscope 742 and a computer system with one or more processors 702 (e.g., CPUs), user interfaces 706, memory 710, and one or more communication buses 704 interconnecting these components. The computer system may be communicatively coupled with the electron microscope 742 through one or more networks 740. The computer system may further include one or more network interfaces (wired and/or wireless, not shown) for communicating with the electron microscope 742 and/or remote computer systems. The electron microscope 742 may be a SEM (e.g., a CD-SEM) or a TEM.

The user interfaces 710 may include a display 707 and one or more input devices 708 (e.g., a keyboard, mouse, touch-sensitive surface of the display 707, etc.). The display 707 may report results of the method 100, 200, and/or 300 (e.g., may report a disposition, a performance estimate, a defect-class prediction, the details of a fabrication-process adjustment, etc.).

Memory 710 includes volatile and/or non-volatile memory. Memory 710 (e.g., the non-volatile memory within memory 710) includes a non-transitory computer-readable storage medium. Memory 710 optionally includes one or more storage devices remotely located from the processors 702 and/or a non-transitory computer-readable storage medium that is removably inserted into the computer system. In some embodiments, memory 710 (e.g., the non-transitory computer-readable storage medium of memory 710) stores the following modules and data, or a subset or superset thereof: an operating system 712 that includes procedures for handling various basic system services and for performing hardware-dependent tasks, a structure-modeling module 714 for creating geometric models of semiconductor structures (e.g., as used in the method 400, FIG. 4), a process simulation module 716 (e.g., for use in the method 500, FIG. 5), an image-simulation module 718 for generating simulated electron-microscope images (e.g., in accordance with steps 108, FIGS. 1-2, 406, FIG. 4, and/or 504, FIG. 5), a model-training module 720 (e.g., for use in steps 112 and/or 212, FIGS. 1-2), a value-prediction module 722 (e.g., for use in steps 116, FIG. 1 and/or 306, FIG. 3), a defect classification module 724 (e.g., for use in step 216, FIG. 2), a process-adjustment module 726 (e.g., for use in steps 118 and/or 218, FIGS. 1-3), a wafer-dispositioning module 728 (e.g., for use in steps 120 and/or 220, FIGS. 1-3), a performance-estimation module 730 (e.g., for use in step 122, FIGS. 1 and 3), and electron-microscope images 732 (real and/or simulated).

The memory 710 (e.g., the non-transitory computer-readable storage medium of the memory 710) thus includes instructions for performing the method 100 (FIG. 1), 200 (FIG. 2), and/or 300 (FIG. 3). As such, the memory 710 may include instructions for performing the method 400 (FIG. 4) and/or 500 (FIG. 5). Each of the modules stored in the memory 710 corresponds to a set of instructions for performing one or more functions described herein. Separate modules need not be implemented as separate software programs. The modules and various subsets of the modules may be combined or otherwise re-arranged. In some embodiments, the memory 710 stores a subset or superset of the modules and/or data structures identified above.

FIG. 7 is intended more as a functional description of the various features that may be present in a semiconductor-inspection system than as a structural schematic. For example, the functionality of the computer system in the semiconductor-inspection system 700 may be split between multiple devices. A portion of the modules stored in the memory 710 may alternatively be stored in one or more other computer systems communicatively coupled with the computer system of the semiconductor-inspection system 700 through one or more networks.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A method of monitoring semiconductor fabrication, comprising, in a computer system comprising one or more processors and memory storing instructions for execution by the one or more processors:
   obtaining, from a first source, a first plurality of electron-microscope images for respective instances of a semiconductor structure, wherein the electron-microscope images of the first plurality show different values of one or more semiconductor-fabrication parameters;
   training a model that specifies a relationship between the first plurality of electron-microscope images and the values of the one or more semiconductor-fabrication parameters;
   collecting a second plurality of electron-microscope images for respective instances of the semiconductor structure on one or more semiconductor wafers, wherein the one or more semiconductor wafers are distinct from the first source; and
   predicting values of the one or more semiconductor-fabrication parameters for the second plurality of electron-microscope images, using the model.

2. The method of claim 1, wherein the one or more semiconductor-fabrication parameters include at least one of overlay, critical dimension (CD), sidewall angle, or edge-placement error.

3. The method of claim 1, wherein the one or more semiconductor-fabrication parameters include at least one of focus or dose for a photolithographic process step.

4. The method of claim 1, wherein the first and second pluralities of electron-microscope images are critical-dimension SEM (CD-SEM) images.

5. The method of claim 1, wherein:
   the one or more semiconductor wafers are fabricated using a fabrication process; and
   the method further comprises adjusting the fabrication process based at least in part on the predicted values.

6. The method of claim 1, wherein:
   the method further comprises dispositioning the one or more semiconductor wafers based at least in part on the predicted values; and
   dispositioning the one or more semiconductor wafers comprises selecting between continuing to process a respective wafer of the one or more semiconductor wafers, reworking the respective wafer, or scrapping the respective wafer.

7. The method of claim 1, wherein the method further comprises estimating performance of semiconductor devices on the one or more semiconductor wafers based at least in part on the predicted values.

8. The method of claim 1, wherein:
   the first source comprises a design-of-experiments (DOE) wafer in which different fields are fabricated to have the different values;
   respective images of the first plurality of electron-microscope images are obtained from respective fields of the DOE wafer; and
   the method further comprises, after the obtaining and before the training, determining the values of the one or more semiconductor-fabrication parameters for the first plurality of electron-microscope images using a reference metrology tool.

9. The method of claim 1, wherein:
   the first source comprises a plurality of DOE wafers in which different wafers are fabricated to have the different values;
   respective images of the first plurality of electron-microscope images are obtained from respective wafers of the plurality of DOE wafers; and
   the method further comprises, after the obtaining and before the training, determining the values of the one or more semiconductor-fabrication parameters for the first plurality of electron-microscope images using a reference metrology tool.

10. The method of claim 1, wherein:
    the first plurality of electron-microscope images comprises simulated electron-microscope images; and
    obtaining the first plurality of electron microscope images from the first source comprises:
        creating a geometric model of the semiconductor structure, wherein the geometric model is parameterized with the one or more semiconductor-fabrication parameters;
        varying the one or more semiconductor-fabrication parameters for the geometric model to generate variations of the geometric model having the different values of one or more semiconductor-fabrication parameters; and
        generating the simulated electron-microscope images using respective variations of the geometric model.

11. The method of claim 1, wherein:
    the first plurality of electron-microscope images comprises simulated electron-microscope images;
    obtaining the first plurality of electron microscope images from the first source comprises:
        using a process simulator, parameterized with process parameters, to create a process-based model of the semiconductor structure, comprising varying the process parameters for the process simulator to produce respective simulated instances of the semiconductor structure having the different values of one or more semiconductor-fabrication parameters; and
        generating the simulated electron-microscope images using the respective simulated instances of the semiconductor structure; and
    the method further comprises, before the training, determining the values of the one or more semiconductor-fabrication parameters for the simulated electron-microscope images.

12. A method of monitoring semiconductor fabrication, comprising, in a computer system comprising one or more processors and memory storing instructions for execution by the one or more processors:
    obtaining, from a first source, a first plurality of electron-microscope images for respective instances of a semiconductor structure, wherein the electron-microscope images of the first plurality show different values of one or more semiconductor-fabrication parameters;
    associating the first plurality of electron-microscope images with respective defect classes;
    training a model that specifies a relationship between the first plurality of electron-microscope images and the defect classes;
    collecting a second plurality of electron-microscope images for respective instances of the semiconductor structure on one or more semiconductor wafers, wherein the one or more semiconductor wafers are distinct from the first source; and
    predicting one or more defect classes for defects on the one or more semiconductor wafers, using the model.

13. The method of claim 12, further comprising performing, based at least in part on the predicted one or more defect classes, an action selected from the group consisting of:
 adjusting a fabrication process used to fabricate the one or more semiconductor wafers; and
 dispositioning the one or more semiconductor wafers, comprising selecting between continuing to process a respective wafer of the one or more semiconductor wafers, reworking the respective wafer, or scrapping the respective wafer.

14. The method of claim 12, wherein:
 the first source comprises a design-of-experiments (DOE) wafer in which different fields are fabricated to have the different values;
 respective images of the first plurality of electron-microscope images are obtained from respective fields of the DOE wafer; and
 the respective defect classes comprise defect classes on the DOE wafer.

15. The method of claim 12, wherein:
 the first source comprises a plurality of DOE wafers in which different wafers are fabricated to have the different values;
 respective images of the first plurality of electron-microscope images are obtained from respective wafers of the plurality of DOE wafers; and
 the respective defect classes comprise defect classes on the plurality of DOE wafers.

16. The method of claim 12, wherein training the model comprises:
 using unsupervised learning to determine the relationship between the first plurality of electron-microscope images and the defect classes while types of defects for the defect classes are unspecified; and
 after using unsupervised learning to determine the relationship, labelling the defect classes with labels that specify the types of defects for the defect classes.

17. The method of claim 12, wherein:
 the first plurality of electron-microscope images comprises simulated electron-microscope images; and
 obtaining the first plurality of electron microscope images from the first source comprises:
  creating a geometric model of the semiconductor structure, wherein the geometric model is parameterized with the one or more semiconductor-fabrication parameters;
  varying the one or more semiconductor-fabrication parameters for the geometric model to generate variations of the geometric model having the different values of one or more semiconductor-fabrication parameters; and
  generating the simulated electron-microscope images using respective variations of the geometric model.

18. The method of claim 12, wherein:
 the first plurality of electron-microscope images comprises simulated electron-microscope images; and
 obtaining the first plurality of electron microscope images from the first source comprises:
  using a process simulator, parameterized with process parameters, to create a process-based model of the semiconductor structure, comprising varying the process parameters for the process simulator to produce respective simulated instances of the semiconductor structure having the different values of one or more semiconductor-fabrication parameters; and
  generating the simulated electron-microscope images based on the respective simulated instances of the semiconductor structure.

19. A method of monitoring semiconductor fabrication, comprising, in a computer system comprising one or more processors and memory storing instructions for execution by the one or more processors:
 obtaining simulated electron-microscope images for respective modeled instances of a semiconductor structure, wherein the simulated electron-microscope images show different values of one or more semiconductor-fabrication parameters;
 collecting a plurality of electron-microscope images for respective instances of the semiconductor structure on one or more semiconductor wafers; and
 predicting values of the one or more semiconductor-fabrication parameters for the plurality of electron-microscope images using the simulated electron-microscope images, comprising performing a regression analysis between the plurality of electron-microscope images and the simulated electron-microscope images.

20. The method of claim 19, wherein obtaining the simulated electron-microscope images comprises:
 creating a geometric model of the semiconductor structure, wherein the geometric model is parameterized with the one or more semiconductor-fabrication parameters;
 varying the one or more semiconductor-fabrication parameters for the geometric model to generate the respective modeled instances of the semiconductor structure; and
 generating the simulated electron-microscope images using the respective modeled instances of the semiconductor structure.

21. The method of claim 19, wherein:
 obtaining the simulated electron-microscope images comprises:
  using a process simulator, parameterized with process parameters, to create a process-based model of the semiconductor structure, comprising varying the process parameters for the process simulator to produce the respective modeled instances of the semiconductor structure; and
  generating the simulated electron-microscope images using the respective simulated instances of the semiconductor structure; and
 the method further comprises, before the training, determining the values of the one or more semiconductor-fabrication parameters for the simulated electron-microscope images.

22. The method of claim 19, further comprising performing, based at least in part on the predicted values, an action selected from the group consisting of:
 adjusting a fabrication process used to fabricate the one or more semiconductor wafers;
 dispositioning the one or more semiconductor wafers, comprising selecting between continuing to process a respective wafer of the one or more semiconductor wafers, reworking the respective wafer, or scrapping the respective wafer; and
 estimating performance of semiconductor devices on the one or more semiconductor wafers.

* * * * *